United States Patent
Li et al.

(10) Patent No.: US 10,084,457 B2
(45) Date of Patent: Sep. 25, 2018

(54) FREQUENCY SYNTHESIZER WITH TUNABLE ACCURACY

(71) Applicant: Integrated Device Technology, Inc., San Jose, CA (US)

(72) Inventors: Hui Li, Fremont, CA (US); Teck-Chuan Ng, San Jose, CA (US); Stephen E. Aycock, Napa, CA (US)

(73) Assignee: INTEGRATED DEVICE TECHNOLOGY, INC., San Jose, CA (US)

(*) Notice: Subject to any disclaimer, the term of this patent is extended or adjusted under 35 U.S.C. 154(b) by 0 days.

(21) Appl. No.: 15/408,655

(22) Filed: Jan. 18, 2017

(65) Prior Publication Data

US 2018/0205382 A1    Jul. 19, 2018

(51) Int. Cl.
| | | |
|---|---|---|
| H03L 7/18 | (2006.01) | |
| H03L 1/00 | (2006.01) | |
| H03L 7/183 | (2006.01) | |
| H03K 21/02 | (2006.01) | |
| H03M 3/00 | (2006.01) | |

(52) U.S. Cl.
CPC .............. *H03K 21/02* (2013.01); *H03M 3/39* (2013.01)

(58) Field of Classification Search
CPC . H03K 21/02; H03M 3/39; H03L 1/00; H03L 7/18

USPC .............. 327/2–12, 105–123, 141, 144–163; 331/15–17; 375/373–376

See application file for complete search history.

(56) References Cited

U.S. PATENT DOCUMENTS

| | | | |
|---|---|---|---|
| 8,552,804 B1 | 10/2013 | Ren et al. ................... 331/2 |
| 9,838,024 B2 * | 12/2017 | Chen ................. H03L 7/0802 |
| 2005/0090222 A1 * | 4/2005 | Knecht ............... H03B 5/368 |
| | | | 455/333 |
| 2008/0082279 A1 | 4/2008 | Ashburn et al. ............ 702/85 |
| 2008/0107154 A1 * | 5/2008 | Hsiao-Chyi ........ H03L 7/0891 |
| | | | 375/130 |
| 2010/0013532 A1 * | 1/2010 | Ainspan ................ H03L 7/093 |
| | | | 327/159 |
| 2011/0227621 A1 * | 9/2011 | Ridgers .................. G04F 10/00 |
| | | | 327/159 |
| 2015/0130544 A1 * | 5/2015 | Gao ...................... H03L 7/091 |
| | | | 331/18 |
| 2016/0028405 A1 * | 1/2016 | Caffee ..................... H03L 7/02 |
| | | | 331/66 |

* cited by examiner

*Primary Examiner* — Brandon S Cole
(74) *Attorney, Agent, or Firm* — Christopher P. Maiorana, PC

(57) ABSTRACT

An apparatus includes a first circuit, a second circuit and a third circuit. The first circuit may be configured to generate a first code by counting a number of cycles of an input clock signal in a period determined by (i) an output clock signal and (ii) a second code. The second code may be variable. The second circuit may be configured to generate a third code by a delta-sigma modulation of the first code. The third circuit may be configured to generate the output clock signal (i) in response to the third code and (ii) within an accuracy determined the second code.

20 Claims, 9 Drawing Sheets

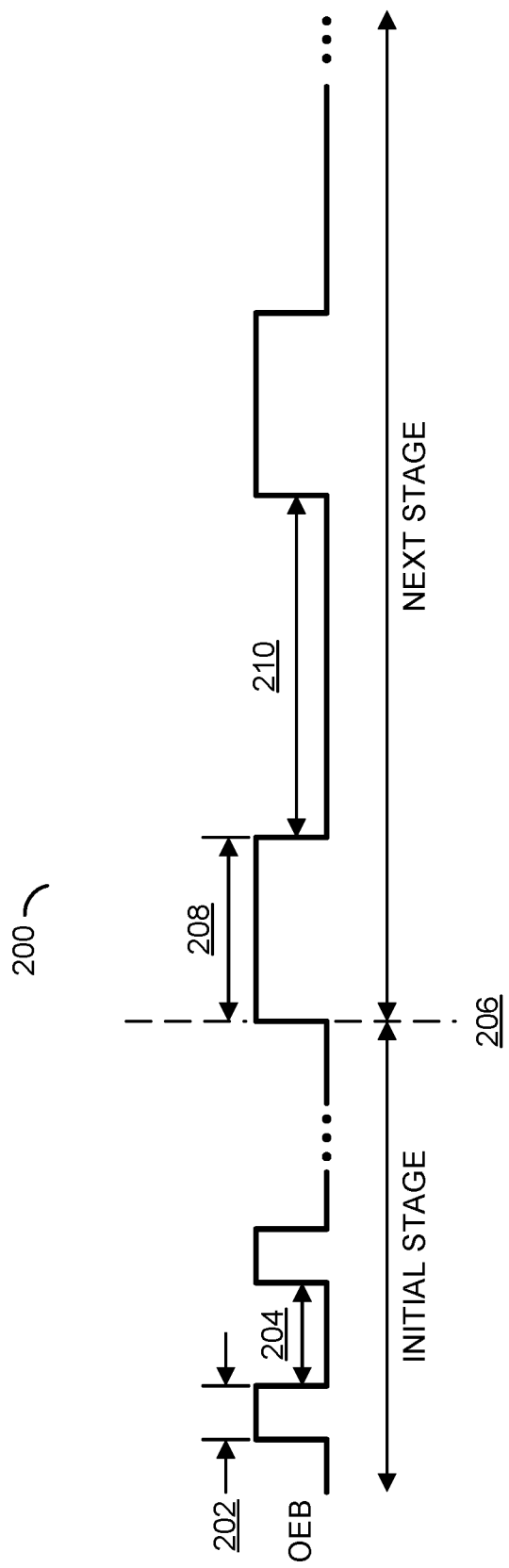

FREQUENCY SYNTHESIZER WITH TUNABLE ACCURACY

FIELD OF THE INVENTION

The invention relates to controlled oscillators generally and, more particularly, to a method and/or apparatus for implementing a frequency synthesizer with tunable accuracy.

BACKGROUND

Accuracies of conventional low frequency clock signals are commonly determined by a resolution of a controllable oscillator. Since a resolution of a control signal used by the oscillator is often fixed, the accuracy of the low frequency clock signal is also fixed. Drift and cycle-to-cycle jitter can be less than a least significant bit of the control signal and so cannot be corrected by adjusting the control signal.

It would be desirable to implement a frequency synthesizer with tunable accuracy.

SUMMARY

The invention concerns an apparatus including a first circuit, a second circuit and a third circuit. The first circuit may be configured to generate a first code by counting a number of cycles of an input clock signal in a period determined by (i) an output clock signal and (ii) a second code. The second code may be variable. The second circuit may be configured to generate a third code by a delta-sigma modulation of the first code. The third circuit may be configured to generate the output clock signal (i) in response to the third code and (ii) within an accuracy determined the second code.

BRIEF DESCRIPTION OF THE FIGURES

Embodiments of the invention will be apparent from the following detailed description and the appended claims and drawings in which:

FIG. 9 is a diagram of an output enable signal during a calibration process.

DETAILED DESCRIPTION OF THE EMBODIMENTS

Embodiments of the present invention include providing a frequency synthesizer with tunable accuracy that may (i) adjust an output clock frequency, (ii) tune an accuracy of the output clock frequency, (iii) adjust a power consumption, (iv) provide rapid convergence of the output clock frequency, (v) utilize multistage operations to obtain final accuracy and/or (vi) be implemented as one or more integrated circuits.

An architecture and/or technique of the invention may generate low speed clock signal having a tunable accuracy. For many applications, a power consumption of the invention may be adjustable as accuracy of the low speed clock signal is tuned. In some embodiments, the architecture may include a small-input (e.g., 4 to 8-bit input) digitally-controlled oscillator to generate the low speed clock signal with a long time accuracy of around 1 part-per-million (PPM).

Figure 1:
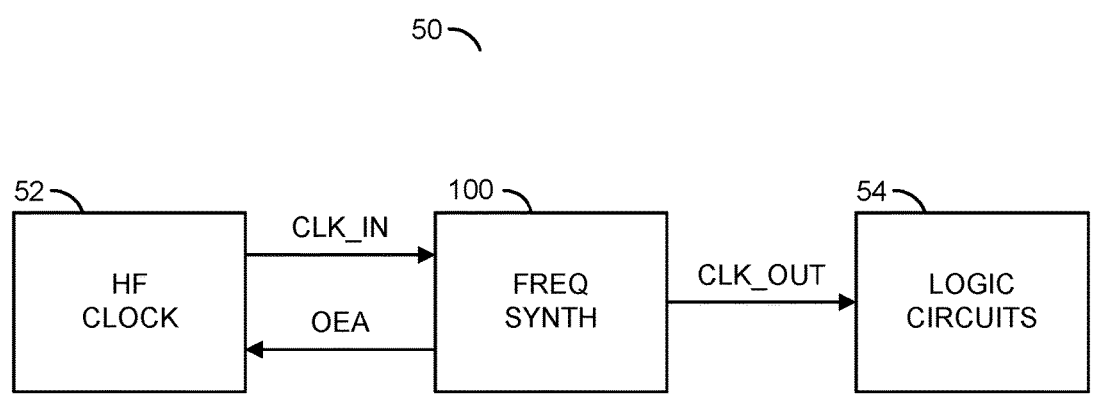
FIG. 1 is a block diagram of an apparatus.

Referring to FIG. 1, a block diagram of an apparatus 50 is shown. The apparatus (or circuit or device or system) 50 may implement a device that utilizes a real time clock. The apparatus 50 generally comprises a block (or circuit) 52, a block (or circuit) 54 and a block (or circuit) 100. In various embodiments, the apparatus 50 may be implemented as one or more integrated circuits. The apparatus 50 may be implemented in one or more of wireless devices, smart telephones, lower power devices, portable electronics and the like.

A signal (e.g., CLK_IN) may be generated by the circuit and presented to the circuit 100. The signal CLK_IN may represent a high speed (or high frequency) clock signal. The circuit 100 may generate a signal (e.g., OEA) received by the circuit 52. The signal OEA may carry output enable control from the circuit 100 to the circuit 52 for the signal CLK_IN. A signal (e.g., CLK_OUT) may be generated by the circuit 100 and received by the circuit 54. The signal CLK_OUT may represent a low speed (or low frequency) clock signal.

The circuit 52 may implement a high frequency (HF) clock circuit. The HF clock circuit 52 is generally operational to generate the signal CLK_IN in response to the signal OEA. While the signal OEA is in an enabled state, the HF clock circuit 52 may actively generate the signal CLK_IN. While the signal OEA is in a disabled state, the HF clock circuit 52 may stop generation of the signal CLK_IN. The HF clock circuit 52 may consume more electrical power while the signal OEA is in the enabled state and the signal CLK_IN is being generated than while the signal OEA is in the disabled state and the signal CLK_IN is not being generated. In various embodiments, the HF clock circuit 52 may implement a crystal oscillator circuit. In some embodiments, the HF clock circuit 52 may generate the signal CLK_IN in a range of 20 megahertz (MHz) to 30 MHz (e.g., 25 MHz). Other frequencies may be generated to meet the design criteria of a particular application.

The circuit 54 may implement one or more logic circuits. The logic circuits 54 are generally operational to provide a variety of operations, functions and/or calculations based on the signal CLK_OUT. In some embodiments, the logic circuits 54 may include a real time clock (RTC) operation. In various embodiments, the logic circuits 54 may utilize the signal CLK_OUT in a range of 25 kilohertz (KHz) to 40 KHz (e.g., 32.768 KHz or $2^{15}$ hertz). Other frequencies may be utilized to meet the design criteria of a particular application.

The circuit 100 may implement a frequency synthesizer circuit (or synthesizer for short). The synthesizer 100 is generally operational to generate the signal CLK_OUT based on the signal CLK_IN and an adjustable accuracy code value. In various embodiments, the synthesizer 100 may be operational to generate a tune code by counting a number of cycles of the signal CLK_IN in a period determined by the signal CLK_OUT and the accuracy code, where the accuracy code is variable, generate a frequency code by a delta-sigma modulation of the tune code, and generate the signal CLK_OUT in response to the frequency code and within an accuracy determined the accuracy code. The synthesizer 100 may also be operational to adjust the accuracy code to achieve different PPM accuracy by different turn-on times (or durations) of the HF clock circuit 52. The different turn-on times of the HF clock circuit 52 may also result in different power consumption levels of the apparatus 50.

Figure 2:
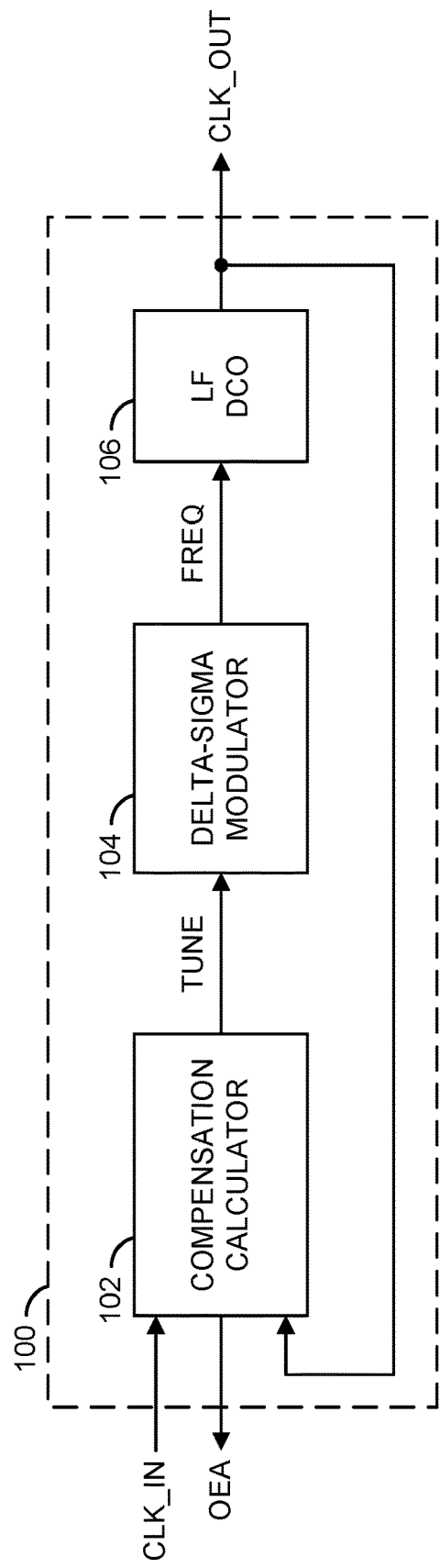
FIG. 2 is a block diagram of a frequency synthesizer in accordance with an embodiment of the invention.

Referring to FIG. 2, a block diagram of an example implementation of the synthesizer 100 is shown in accordance with an embodiment of the invention. The synthesizer 100 generally comprises a block (or circuit) 102, a block (or circuit) 104 and a block (or circuit 106). The signal CLK_IN may be received by the circuit 102. The signal OEA may be generated by the circuit 102. A signal (e.g., TUNE) may be generated by the circuit 102 and received by the circuit 104. The signal TUNE may convey a tune code use to tune the signal CLK_OUT. A signal (e.g., FREQ) may be generated by the circuit 104 and received by the circuit 106. The signal FREQ may convey a frequency code used to set a frequency of the signal CLK_OUT. The circuit 106 may generate the signal CLK_OUT. The signal CLK_OUT may be fed back to the circuit 102.

The circuit 102 may implement a compensation calculator circuit (or calculator for short). The calculator 102 may be operational to count a number of clock cycles of the signal CLK_IN based on a period determined by the signal CLK_OUT and the accuracy code. The tune code may be presented to the circuit 104 to generate a bit stream that controls the generation of the signal CLK_OUT by the circuit 106. As such a long time accuracy of the signal CLK_OUT is tunable and not limited by an input resolution of the circuit 106.

The circuit 104 may implement a delta-sigma modulator (DSM) circuit. The DSM circuit 104 is generally operational to calculate the frequency code in the signal FREQ based on the tune code in the signal TUNE. The DSM circuit 104 may modulate a multi-bit (e.g., 16-24 bit) tune code in the signal TUNE into a smaller multi-bit (e.g., 4-8 bit) frequency code in the signal FREQ. In various embodiments, the DSM circuit 104 may implement a first order delta-sigma modulator circuit. Other orders of delta-sigma modulation may be implemented to meet the design criteria of a particular application.

The circuit 106 may implement a digitally-controlled oscillator (DCO) circuit. The DCO circuit 106 may be operational to generate the signal CLK_OUT based on the frequency code in the signal FREQ. The DCO circuit 106 may implement a multi-bit (e.g., 4-8 bit) digital input to receive the signal FREQ. Based on a 32.768 KHz output frequency of the signal CLK_OUT and an 8-bit resolution of the frequency code in the signal FREQ, the DCO circuit 106 may have a native resolution of approximately 500 ppm for the least significant bit of the 8-bit frequency code. A rate of change in the output frequency of the signal CLK_OUT may be slower than a rate of change in the frequency code. By toggling one or more least significant bits of the frequency code, the output frequency of the signal CLK_OUT may be tuned to a frequency band between integer values established by the frequency code. Variations in the number of bits and the rate of toggling the least significant bits in the frequency code may vary the accuracy of the output frequency of the signal CLK_OUT. In various embodiments, the frequency band may provide a fine accuracy of approximately one ppm for the output frequency of the signal CLK_OUT.

Figure 3:
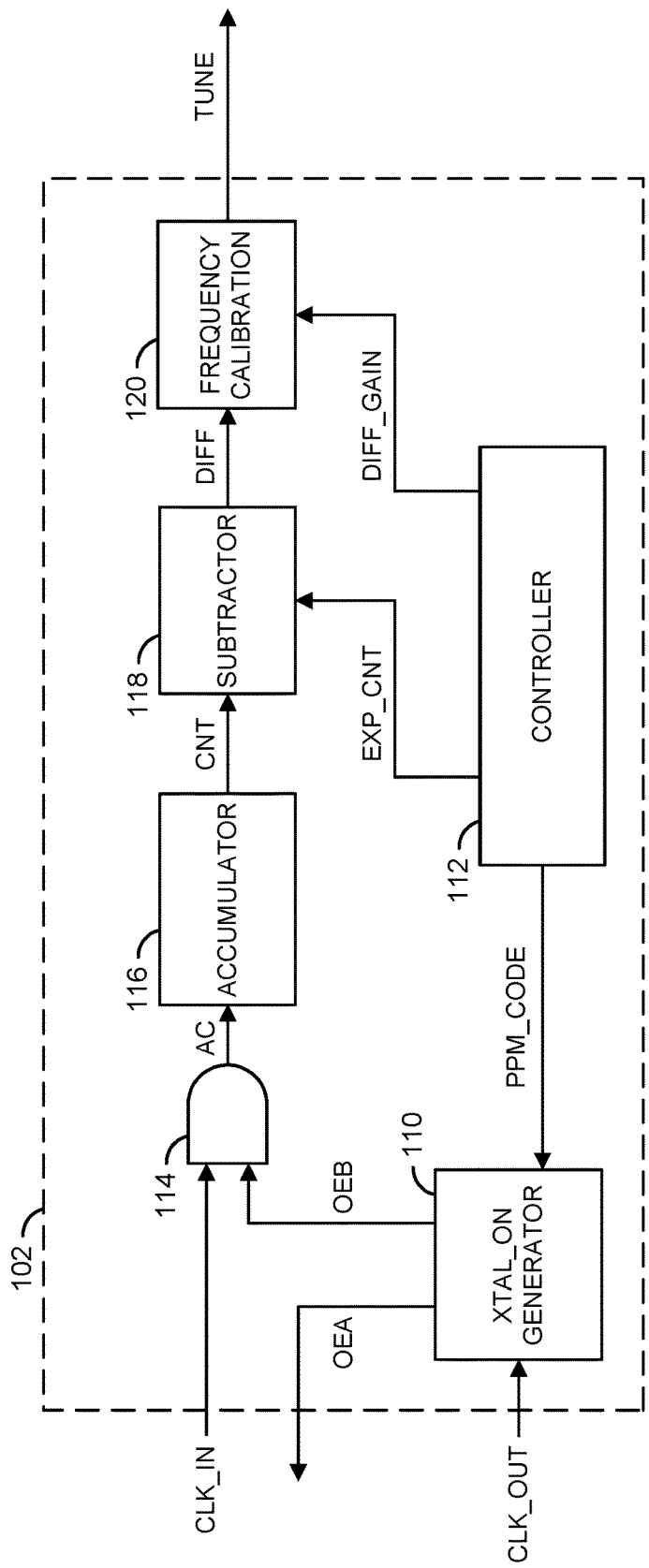
FIG. 3 is a block diagram of a compensation calculator.

Referring to FIG. 3, a block diagram of an example implementation of the calculator 102 is shown. The calculator 102 generally comprises a block (or circuit) 110, a block (or circuit) 112, a block (or circuit) 114, a block (or circuit) 116, a block (or circuit) 118 and a block (or circuit) 120. The signal CLK_IN may be received by the circuit 114. The signal OEA may be generated by the circuit 110. The signal CLK_OUT may be received by the circuit 110. The signal TUNE may be generated by the circuit 120.

A signal (e.g., OEB) may be generated by the circuit 110 and received by the circuit 114. The signal OEB may convey an output enable command used to enable/disable accumulations. A signal (e.g., PPM_CODE) may be generated by the circuit 112 and received by the circuit 110. The signal PPM_CODE may convey an accuracy code used to control an accuracy of the signal CLK_OUT. The circuit 112 may generate a signal (e.g., $EXP_{13}$ CNT) received by the circuit 118. The signal $EXP_{13}$ CNT may carry an expected count value. A signal (e.g., DIFF_GAIN) may be generated by the circuit 112 and received by the circuit 120. The signal DIFF_GAIN may carry a gain value to be applied to a difference value in the signal DIFF.

A signal (e.g., AC) may be generated by the circuit 114 and received by the circuit 116. The signal AC may carry an accumulation clock. The circuit 116 may generate a signal (e.g., CNT) received by the circuit 118. The signal CNT may convey a count value of a number of clock cycles of the signal CLK_IN counted during an accumulation period. The circuit 118 may generate a signal (e.g., DIFF) received by the circuit 120. The signal DIFF may carry the difference value of a difference between the count value in the signal CNT and the expected value in the signal EXP_CNT.

The circuit 110 may implement a clock control (or XTAL on generator) circuit. The clock control circuit 110 is generally operational to generate the signal OEB to control the accumulation period based on the accuracy value received in the signal PPM_CODE. The clock control circuit 110 may also be operational to generate the signal OEA to command the HF clock circuit 52 to power on while the signal OEA is in the enabled state and power off while the signal OEA is in the disabled state.

The circuit 112 may implement a controller circuit. The controller 112 is generally operational to control the frequency accuracy of the signal CLK_OUT by controlling the accumulation period, the expected count value in the signal EXP_CNT and the gain value in the signal DIFF_GAIN. The gain value (e.g., diff_gain) may be calculated as a function of an expected DCO code (e.g., exp_DC_code) value and an expected count value (e.g., exp_cnt) per formula 1 as follows:

$$\text{diff\_gain} = \text{exp\_DCO\_code} / \text{exp\_cnt} \qquad (1)$$

The accumulation period may be controlled as multiple (e.g., two) stages. In an initial stage, the controller 112 may adjust the circuitry to allow the signal CLK_OUT to rapidly stabilize to a coarse accuracy (e.g., 500 ppm). In a next stage, the controller 112 may adjust the circuits to drive the frequency of the signal CLK_OUT to a fine accuracy (e.g., 1 ppm). Other frequency bands of accuracy of the signal CLK_OUT may be established by the controller 112.

The circuit 114 may implement a logic gate. The logic gate 114 is generally operational to perform a Boolean AND operation on the signals CLK_IN and OEB to create the signal AC. The logic gate 114 may gate the signal CLK_IN to the signal AC based on the state of the signal OEB. While the signal OEB is in the enabled state (e.g., a logical high), the signal AC may follow the signal CLK_IN. While the signal OEB is in the disabled state (e.g., a logical low), the signal AC may be held in a steady condition (e.g., a low voltage).

The circuit 116 may implement an accumulator (or counter) circuit. The accumulator 116 is generally operational to count the number of clock cycles in the signal AC (same as the signal CLK_IN while the signal OEB is enabled). The number of clock cycles accumulated during the accumulation period may be presented as a count value in the signal CNT.

The circuit 118 may implement a subtractor circuit. The subtractor 118 is generally operational to subtract the expected count value in the signal EXP_CNT from the accumulated count value in the signal CNT to calculate a difference value. The difference value may be presented in the signal DIFF.

The circuit 120 may implement a frequency calibration circuit. The frequency calibration circuit 120 may be operational to generate the tune code based on the difference value in the signal DIFF and the gain value in the signal DIFF_GAIN. In some embodiments, the tune code may include an integer portion and a fractional portion. The tune code may be presented in the signal TUNE.

Figure 4:
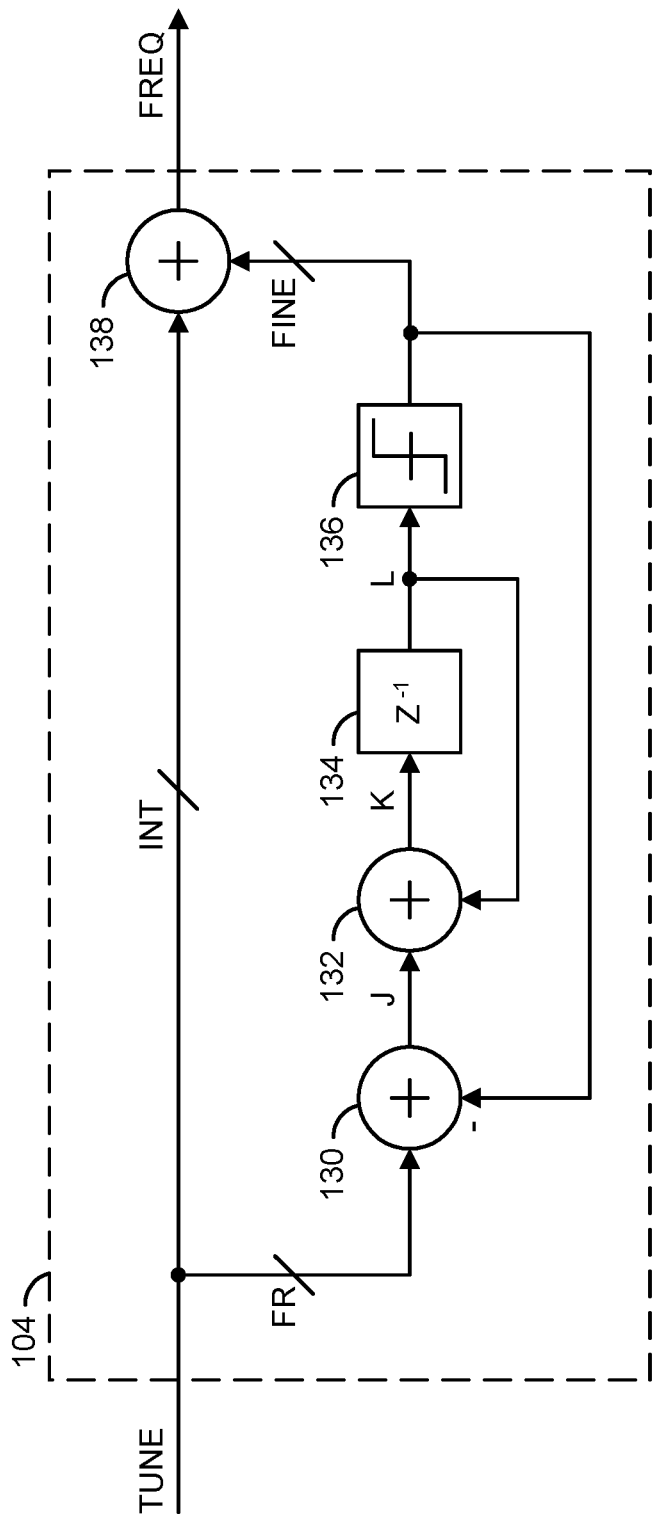
FIG. 4 is a block diagram of a delta-sigma modulation circuit.

Referring to FIG. 4, a block diagram of an example implementation of the DSM circuit 104 is shown. The DSM circuit 104 generally comprises a block (or circuit) 130, a block (or circuit) 132, a block (or circuit) 134, a block (or circuit) 136, a block (or circuit) 136 and a block (or circuit) 138. The integer portion of the signal TUNE (e.g., the signal INT) may be received by the circuit 138. The fractional portion of the signal TUNE (e.g., the signal FR) may be received by the circuit 130. The signal FREQ may be generated by the circuit 138. A signal (e.g., FINE) may be generated by the circuit 136 and received by the circuit 138. A signal (e.g., J) may be generated by the circuit 130 and received by the circuit 132. A signal (e.g., K) may be generated by the circuit 132 and received by the circuit 134. The circuit 134 may generate a signal (e.g., L) received by the circuit 136 and the circuit 132.

The circuits 130 and 132 may implement adder circuits. The adder 130 may sum the fractional value in the signal FR with an inverse of a fine value in the signal FINE. The fractional value may be a multi-bit (e.g., 8-16 bit) portion of the tune code. In some embodiments, the fractional value may be a 12-bit value. The fine value may be a single-bit or multi-bit (e.g., 1-3 bit) value. In some embodiments, the fine value may be a single-bit value. The resulting value may be presented in the signal J to the adder 132. The adder 132 may add the resulting value received in the signal J with a feedback value received in the signal L. A sum value of the adder 132 may be presented in the signal K to the circuit 134.

The circuit 134 may implement a unit delay block. The delay block 134 may delay (e.g., $Z^{-1}$) the sum value received from the adder 132 by a sample period. The delayed sum value may be presented from the delay block 134 in the signal L to the circuit 136 and the circuit 132.

The circuit 136 may implement a slicer circuit. The slicer 136 is generally operational to slice the delayed sum received from the delay stage 134 to generate the fine value in the signal FINE. In various embodiments, the slicer 136 may generate the signal FINE as a single-bit value.

The circuit 138 may implement an adder circuit. The adder 138 may be operational to add the integer portion (e.g., 6-10 bits) of the tune code to the fine value to generate the frequency code. In some embodiments, the integer value may be an 8-bit value and the frequency code may be an 8-bit value.

Figure 5:
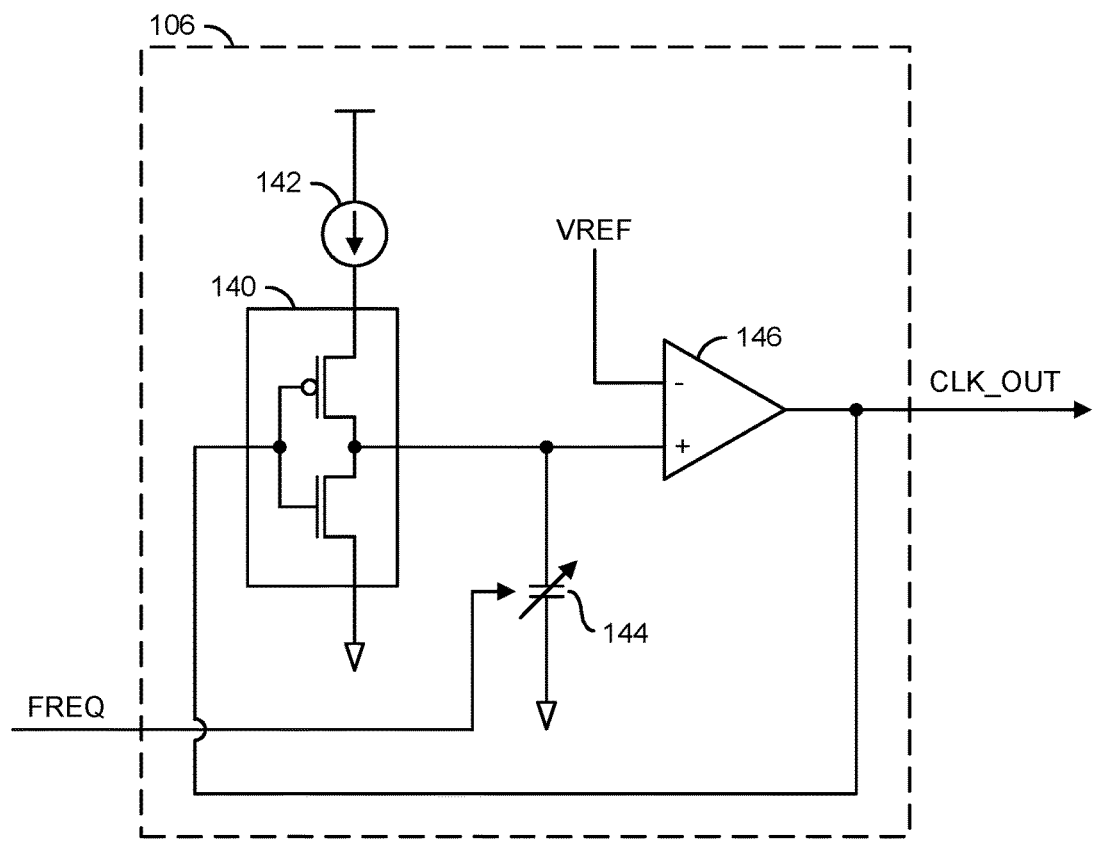
FIG. 5 is a block diagram of a digitally-controlled oscillator.

Referring to FIG. 5, a block diagram of an example implementation of the DCO circuit 106 is shown. The DCO circuit 106 generally comprises a block (or circuit) 140, a block (or circuit) 142, a block (or circuit) 144 and a block (or circuit) 146. The signal FREQ may be received by the circuit 144. The signal CLK_OUT may be generated by the circuit 146 and fed back to an input node of the circuit 144. A signal (e.g., VREF) may be generated internal to the DCO circuit 106 and received by the circuit 146. The signal VREF may present a reference voltage to the circuit 146.

The circuit 140 may implement an inverter circuit with the circuit 142 acting as a load. In some embodiments, the inverter circuit 140 may be implemented with a pair of CMOS transistors. The load circuit 142 may be implemented as a constant current source.

The circuit 144 may implement a variable capacitor circuit. The variable capacitor 144 may be operational to present a variable capacitance on an output line of the inverter 140. The variable capacitance is generally controlled by the frequency code in the signal FREQ. In various embodiments, the variable capacitor 144 may implement multiple (e.g., 16 to 256) discrete capacitance values as determined by the signal FREQ.

The circuit 146 may implement a comparator circuit. The comparator 146 may be operational to compare the voltage on the variable capacitor 144 with the reference voltage on the signal VREF. An output node of the comparator 146 may present the signal CLK_OUT.

Figure 6:
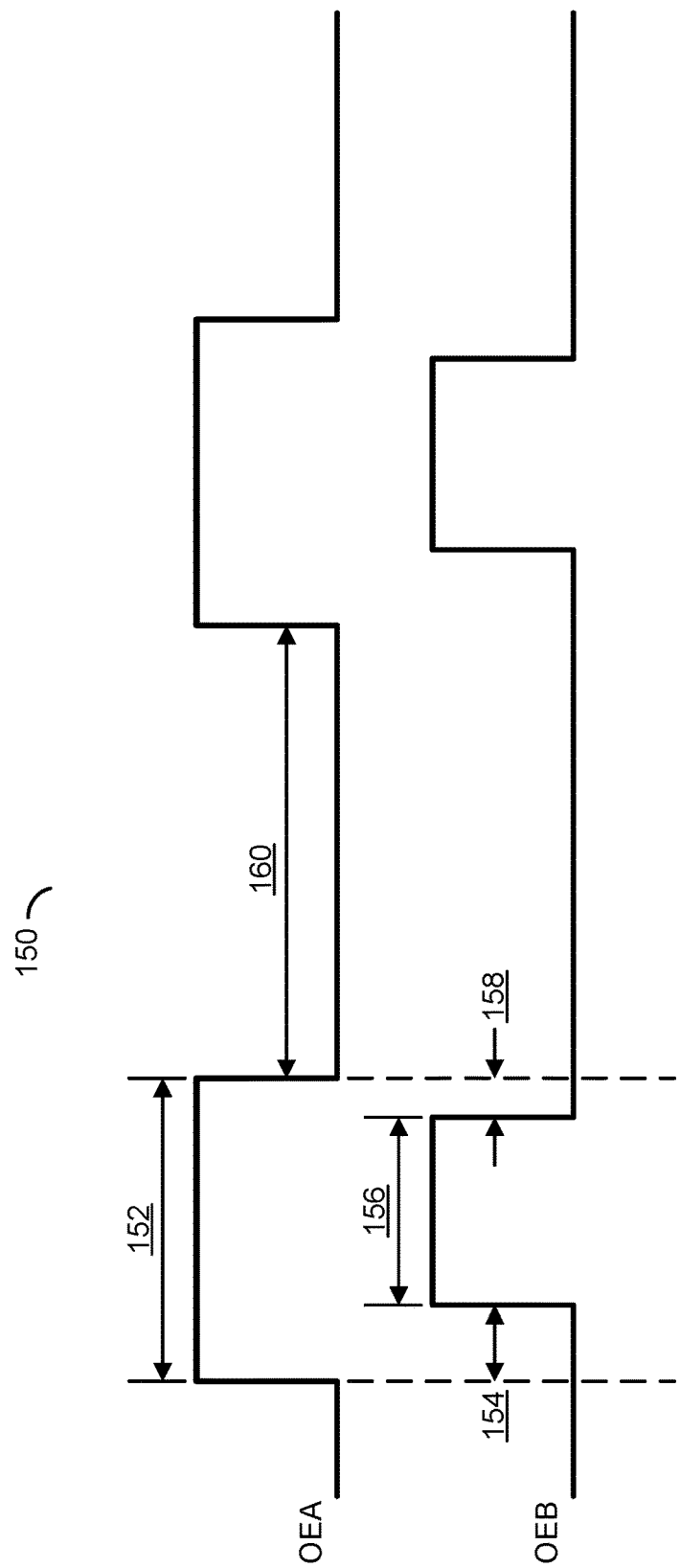
FIG. 6 is a diagram of output enable signal waveforms.

Referring to FIG. 6, a diagram 150 of example waveforms for the output enable signals OEA and OEB is shown. During a period 152, the clock control circuit 110 may assert the signal OEA in the enabled state to command the HF clock circuit 52 to power up and oscillate. A period 154, the clock control circuit 110 may wait for the HF clock circuit 52 to start up and settle the signal CLK_IN. At an end of the period 154, the clock control circuit 110 may assert the signal OEB in the enabled state. During a period 156 (e.g., the accumulation period), with the signal CLK_IN stable and the signal OEB enabled, the logic gate 114 may pass the signal CLK_IN through as the signal AC to the accumulator 116. At the end of the accumulate period 156, the clock control circuit 110 may disable the signal OEB. The accumulator 116, the subtractor 118, the frequency calibration circuit 120 may calculate the tune code in the signal TUNE during a period 158. At an end of the period 158, the clock control circuit 110 may disable the signal OEA thereby powering off the HF clock circuit 52 to save power. The calculator 102 and the DSM circuit 104 may hold the tune code and the frequency code steady during a period 160 while the HF clock circuit 52 is powered off. The DCO circuit 106 may use the steady frequency code received during the period 160 to generate the signal CLK_OUT in a free-running mode.

The accumulate time 156 may be tunable according to the accuracy code value (e.g., ppm_code). The accuracy code value generally defines how may clock cycles of the signal CLK_IN are accumulated to check the frequency of the signal CLK_OUT. An accumulation period (e.g., $T_{CLK\_OUT}$) may be related to a period of the signal CLK_IN (e.g., $T_{CLK\_IN}$) based on the ppm_code value and the expected count value (e.g., exp_cnt) by formula 2 as follows:

$$T_{CLK\_OUT} \times \text{ppm\_code} = T_{CLK\_IN} \times \text{exp\_cnt} \qquad (2)$$

The ppm_code value may be stored in a register within the controller 112. The ppm_code value may be adjustable and calculated according to system accuracy criteria. Larger values of exp_cnt generally means a higher accuracy is requested. The higher accuracy may cause the HF clock circuit 52 on-time to be longer. The longer on-time for the HF clock circuit 52 generally results in a higher power consumption for each calibration round.

Figure 7:
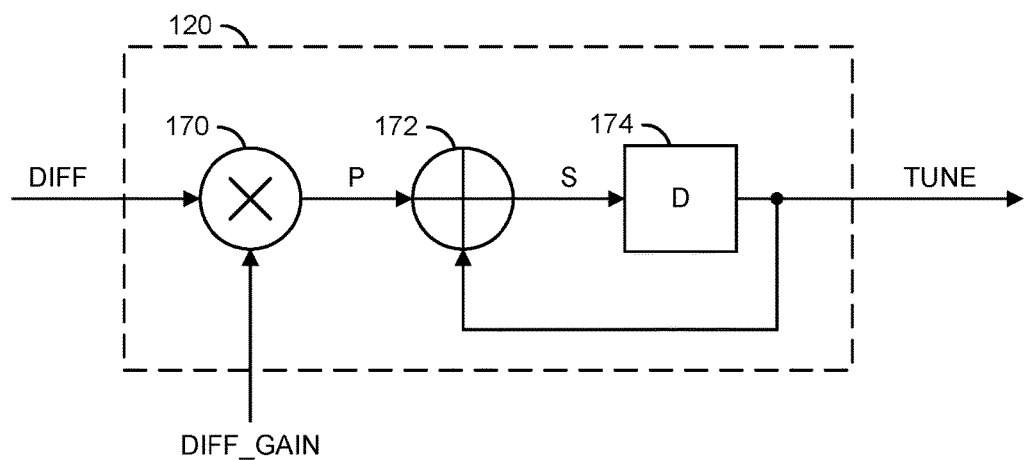
FIG. 7 is a block diagram of a frequency calibration circuit.

Referring to FIG. 7, a block diagram of an example implementation of the frequency calibration circuit 120 is shown. The frequency calibration circuit 120 generally comprises a block (or circuit) 170, a block (or circuit) 172 and a block (or circuit) 174. The signal DIFF may be received by the circuit 170. The signal DIFF_GAIN may be received by the circuit 170. The signal TUNE may be generated by the circuit 174 and received by the circuit 172. A signal (e.g., P) may be generated by the circuit 170 and received by the circuit 172. The signal P may carry a product value. A signal (e.g., S) may be generated by the circuit 172 and received by the circuit 174. The signal S may carry a sum value.

The circuit 170 may implement a multiplier circuit. The multiplier 170 is generally operational to multiply the difference code received in the signal DIFF by the gain value received in the signal DIFF_GAIN. A product value of the multiplication may be presented o the circuit 172 in the signal P.

The circuit 172 may implement an adder circuit. The adder 172 is generally operational to add the product value received in the signal P with the tune code received in the signal TUNE. A sum value of the addition may be presented in the signal S to the circuit 174.

The circuit 174 may implement a delay circuit. The circuit 174 is generally operational to delay the sum value received in the signal S for a clock cycle. The delayed sum value may be presented as the tune code in the signal TUNE.

Figure 8:
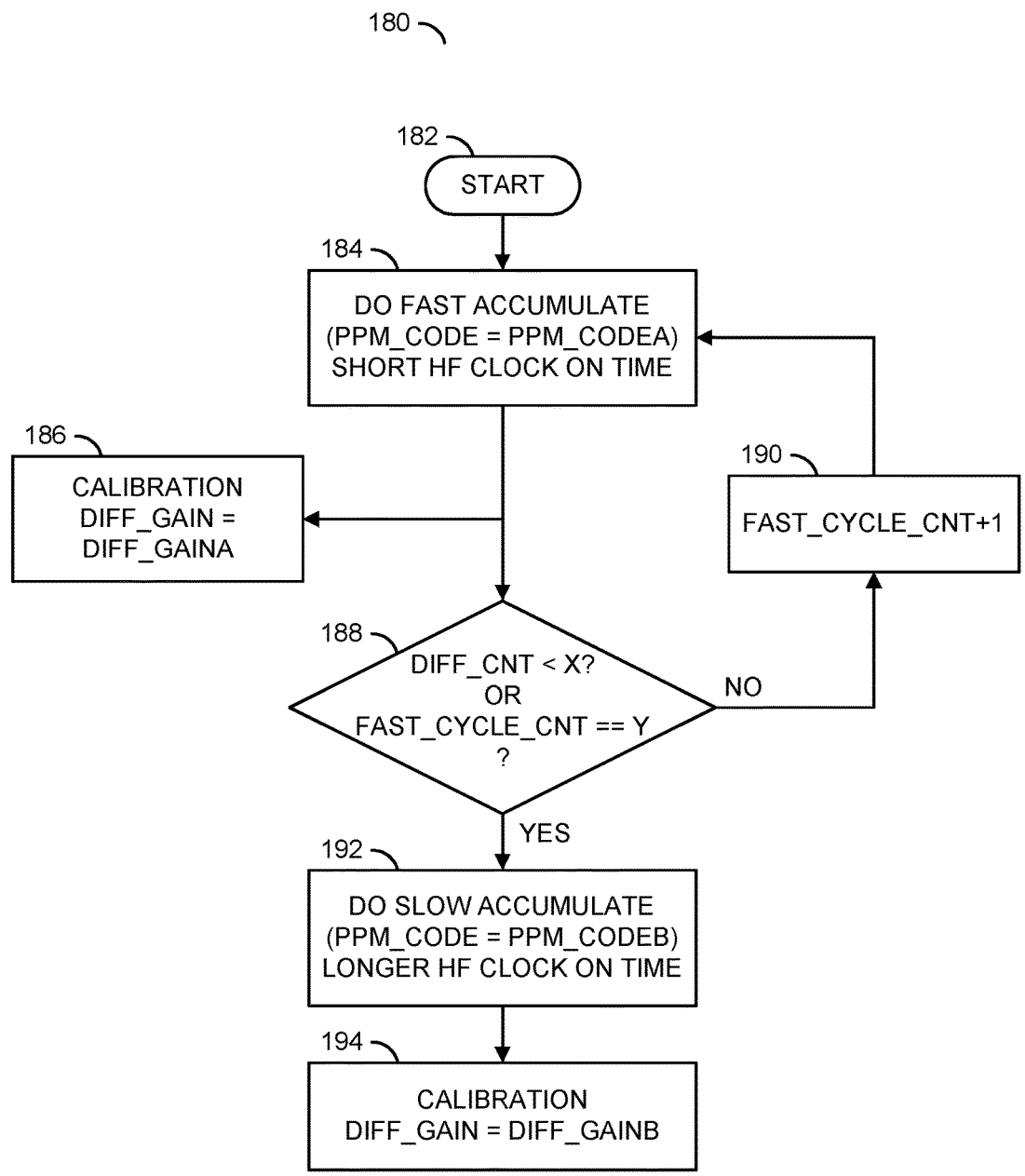
FIG. 8 is a flow diagram of a method of calibration.

Referring to FIG. 8, a flow diagram of an example method 180 of calibration is shown. The method (or process) 180 may be implemented by the synthesizer 100. The method 180 generally comprises a step (or state) 182, a step (or state) 184, a step (or state) 186, a decision step (or state) 188, a step (or state) 190, a step (or state) 192 and a step (or state) 194.

The method 180 may begin in the step 182 with the HF clock 52 inactive and the synthesizer 100 starting to operate. The initial accuracy error (e.g., ppm error) may be large, so the step 184 may implement a fast-accumulate stage. The fast-accumulate stage generally uses a short accumulate period and interval time to let a frequency of the signal CLK_OUT quickly settle close to the target frequency (e.g., exp_DCO_code). In the fast-accumulation stage, the accuracy code may be set to an initial accuracy value (e.g., ppm_code=ppm_codeA). The initial accuracy value may be stored in a register. A fast cycle counter (e.g., fast_cycle_cnt) may be initialized (e.g., set to zero). In the step 186, the gain value may be set to an initial gain value (e.g., diff_gain=diff_gainA). The initial gain value may be used for coarse tuning of the signal CLK_OUT.

The decision step 188 may check on the progress of settling the signal CLK_OUT to the coarse value. If the difference count value diff_cnt is less than a target threshold value X (e.g., X=2 to 4), or the fast cycle has already been performed Y time (e.g., fast_cycle_cnt=Y, where Y=6 to 10 times), the method 180 may transition to a slow-accumulate stage (e.g., step 192). If not, the method 180 may proceed to the step 190 where the fast cycle count value is incremented by one.

The slow-accumulation stage generally uses a longer accumulate time to achieve a lower ppm error in the signal CLK_OUT. In the step 192, the accuracy code may be set to a lower value (e.g., ppm_code=ppm_codeB, where ppm_codeB is smaller than ppm_codeA). The HF clock circuit 52 may also be commanded to run for the longer accumulation time. In the step 194, the gain value may be set to another value (e.g., diff_gain=diff_gainB, where diff_gainB is smaller than diff_gainA). The gain specified by diff_gainB may be smaller than the gain specified by diff_gainA because the accumulator 116 generally produces larger numbers while in the slow-accumulation stage. To compensate for the larger numbers, the diff_gain value may be reduced to keep the tune code in the signal TUNE consistent.

After the slow-accumulation stage has finished, the DCO circuit 106 may be free running. Because the frequency of the signal CLK_OUT is close to the target frequency, a longer interval time (e.g., period 160) may be used to save power. After the interval time, the synthesizer 100 may repeat the calibration method 180 to re-calibrate the frequency of the signal CLK_OUT.

Referring to FIG. 9, a diagram 200 of an example waveform of the signal OEB during a calibration process is shown. During the initial (e.g., fast accumulation) stage, the signal OEB may be cycled to the enabled state during a short accumulation period 202. During the short accumulation period 202, the signal CLK_OUT may be rapidly adjusted to be at or close to a coarse target frequency value. During a period 204, the signal OEB may be deasserted in the disabled state. The calculator 102 may reset during the period 204 in preparation for another fast accumulation stage. The periods 202 and 204 may be repeated one or more times, up to a maximum number of times, to bring the signal CLK_OUT closer and closer to the intended final frequency. In various embodiments, the maximum number may be a predetermined number. In a next stage (e.g., after a time 206), the synthesizer 100 may perform the slow accumulation in a long accumulation period 208 to adjust the frequency of the signal CLK_OUT to a fine accuracy. At the end of long accumulation period 208, the signal OEB may be set to the disabled state and the DCO circuit 106 runs free during the period 210 based on the last frequency code value received at the end of the period 208. The long accumulation period 208 may be repeated from time to time to re-calibrate the frequency of the signal CLK_OUT and maintain the accuracy of the clock signal.

By way of example, the HF clock circuit 52 may implement a 25 MHz crystal oscillator to generate the fast clock signal CLK_IN. The expect output frequency of the signal CLK_OUT may be 32.768 KHz. With an 8-bit frequency code, the least significant bit of the DCO circuit 106 generally represent about a 500 ppm error. So during the initial stage (e.g., before the time 206), the synthesizer 100 may be designed to reach a 500 ppm accuracy in the signal CLK_OUT. The accumulation time may be short (e.g., about 80 microseconds (µs)), and the interval time may also be long (e.g., about 10 milliseconds (ms)). After X (e.g., X=8) fast cycles or if the difference count is less than Y (e.g., diff_cnt<3), the synthesizer 100 may switch to the next stage (e.g., after the time 206).

In the next stage, the target accuracy may be 5 ppm error in the signal CLK_OUT. To achieve a 5 ppm accuracy, the accumulate time 208 may be long (e.g., about 8 ms) and the interval time 210 may be longer (e.g., about 2 seconds). If the target accuracy is a 10 ppm error instead of 5 ppm error, the accumulate time 208 may be less (e.g., around 4 ms). The half-as-long accumulation time may result in the HF clock circuit 52 operating half-as-long thereby saving running power consumed by the HF clock circuit 52.

If the target accuracy is 2 ppm error, the accumulate time 208 may be about twice as long (e.g., around 15 ms) as the 5 ppm error accuracy. The HF clock circuit 52 may run about twice as long to achieve the 2 ppm accuracy. Therefore, the HF clock circuit 52 may consume approximately twice as much running power for 2 ppm error compared to 5 ppm error.

In general, different ppm_code values may be set to achieve different ppm errors in the frequency accuracy of the signal CLK_OUT. The tune codes may be presented to DSM circuit 104. The DSM circuit 104 may generate a bit stream in the signal FREQ to control how the DCO circuit 106 generates the signal CLK_OUT. As such, the long time accuracy of the signal CLK_OUT may be tunable, and not limited by a resolution of the DCO circuit 106.

The functions and structures illustrated in the diagrams of FIGS. 1 to 9 may be designed, modeled, emulated, and/or simulated using one or more of a conventional general purpose processor, digital computer, microprocessor, microcontroller, distributed computer resources and/or similar computational machines, programmed according to the teachings of the present specification, as will be apparent to those skilled in the relevant art(s). Appropriate software, firmware, coding, routines, instructions, opcodes, microcode, and/or program modules may readily be prepared by skilled programmers based on the teachings of the present disclosure, as will also be apparent to those skilled in the relevant art(s). The software is generally embodied in a medium or several media, for example non-transitory storage media, and may be executed by one or more of the processors sequentially or in parallel.

Embodiments of the present invention may also be implemented in one or more of ASICs (application specific integrated circuits), FPGAs (field programmable gate arrays), PLDs (programmable logic devices), CPLDs (complex programmable logic device), sea-of-gates, ASSPs (application specific standard products), and integrated circuits. The circuitry may be implemented based on one or more hardware description languages. Embodiments of the present invention may be utilized in connection with flash memory, nonvolatile memory, random access memory, read-only memory, magnetic disks, floppy disks, optical disks such as DVDs and DVD RAM, magneto-optical disks and/or distributed storage systems.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

While the invention has been particularly shown and described with reference to embodiments thereof, it will be understood by those skilled in the art that various changes in form and details may be made without departing from the scope of the invention.

The invention claimed is:

1. An apparatus comprising:
a first circuit configured to generate a first code by counting a number of cycles of an input clock signal during a period, wherein (a) said period is determined by (i) an output clock signal and (ii) a second code, and (b) said second code (i) is read from a memory internal to said first circuit and (ii) has a variable multi-bit value;
a second circuit configured to generate a third code by a delta-sigma modulation of said first code; and
a third circuit configured to generate said output clock signal (i) in response to said third code and (ii) within a frequency accuracy determined by a current value of said second code.

2. The apparatus according to claim 1, wherein said first circuit is further configured to adjust said second code to change a duration of said period.

3. The apparatus according to claim 1, wherein said first circuit is further configured to set said second code to an initial value that establishes a short duration of said period in which a frequency of said output clock signal is adjusted to a coarse accuracy.

4. The apparatus according to claim 3, wherein said coarse accuracy is achieved when said number of cycles of said input clock during said period minus an expected number falls below a threshold.

5. The apparatus according to claim 3, wherein said first circuit is further configured to set said second code to a subsequent value that establishes a long duration of said period in which said frequency of said output clock signal is adjusted to a fine accuracy.

6. The apparatus according to claim 5, wherein said first circuit is further configured to repeat said short duration at most a given number of times before using said subsequent value.

7. The apparatus according to claim 1, wherein said second circuit is further configured to parse said first code into an integer value and a fractional value.

8. The apparatus according to claim 7, wherein said delta-sigma modulation is applied to said fractional value to generate a fine adjustment value.

9. The apparatus according to claim 8, wherein said third code is generated in said second circuit by adding said fine adjustment value to said integer value.

10. The apparatus according to claim 1, wherein said first circuit is further configured to vary a power consumption of said apparatus based on said second code by alternately enabling and disabling a clock generator from generating said input clock signal.

11. A method for frequency synthesization, comprising the steps of:
generating a first code using a circuit by counting a number of cycles of an input clock signal during a period, wherein (a) said period is determined by (i) an output clock signal and (ii) a second code, and (b) said second code is (i) read from a memory internal to said circuit and (ii) has a variable multi-bit value;
generating a third code by a delta-sigma modulation of said first code; and
generating said output clock signal (i) in response to said third code and (ii) within a frequency accuracy determined by a current value of said second code.

12. The method according to claim 11, further comprising the step of:
adjusting said second code to change a duration of said period.

13. The method according to claim 11, further comprising the step of:
setting said second code to an initial value that establishes a short duration of said period in which a frequency of said output clock signal is adjusted to a coarse accuracy.

14. The method according to claim 13, wherein said coarse accuracy is achieved when said number of cycles of said input clock during said period minus an expected number falls below a threshold.

15. The method according to claim 13, further comprising the step of:
   setting said second code to a subsequent value that establishes a long duration of said period in which said frequency of said output clock signal is adjusted to a fine accuracy.

16. The method according to claim 15, further comprising the step of:
   repeating said short duration at most a given number of times before using said subsequent value.

17. The method according to claim 11, further comprising the step of:
   parsing said first code into an integer value and a fractional value.

18. The method according to claim 17, wherein said delta-sigma modulation is applied to said fractional value to generate a fine adjustment value.

19. The method according to claim 18, wherein said third code is generated by adding said fine adjustment value to said integer value.

20. The method according to claim 11, further comprising the step of:
   varying a power consumption based on said second code by alternately enabling and disabling a clock generator from generating said input clock signal.

* * * * *